(12) United States Patent
Welser et al.

(10) Patent No.: US 11,367,800 B1
(45) Date of Patent: Jun. 21, 2022

(54) OPTICALLY-THIN III-V SOLAR CELLS AND METHODS FOR CONSTRUCTING THE SAME

(71) Applicant: Magnolia Solar, Inc., Woburn, MA (US)

(72) Inventors: Roger E. Welser, Providence, RI (US); Ashok K. Sood, Brookline, MA (US)

(73) Assignee: Magnolia Solar, Inc., Woburn, MA (US)

( * ) Notice: Subject to any disclaimer, the term of this patent is extended or adjusted under 35 U.S.C. 154(b) by 0 days.

(21) Appl. No.: 15/905,698

(22) Filed: Feb. 26, 2018

Related U.S. Application Data

(62) Division of application No. 13/868,018, filed on Apr. 22, 2013, now abandoned.

(60) Provisional application No. 61/736,450, filed on Dec. 12, 2012, provisional application No. 61/636,587, filed on Apr. 20, 2012.

(51) Int. Cl.
*H01L 31/0352* (2006.01)
*H01L 31/0304* (2006.01)

(52) U.S. Cl.
CPC .......... *H01L 31/035281* (2013.01); *H01L 31/03046* (2013.01); *H01L 31/035218* (2013.01)

(58) Field of Classification Search
None
See application file for complete search history.

(56) References Cited

U.S. PATENT DOCUMENTS

| | | | |
|---|---|---|---|
| 5,496,415 A | 3/1996 | Barnham | |
| 5,944,913 A | 8/1999 | Hou et al. | |
| 7,544,884 B2 | 6/2009 | Hollars | |
| 8,895,838 B1 | 11/2014 | Welser et al. | |
| 8,921,687 B1* | 12/2014 | Welser | H01L 31/035236 136/255 |
| 2007/0137695 A1* | 6/2007 | Fetzer | H01L 31/078 136/255 |
| 2008/0163929 A1 | 7/2008 | Krasnov | |
| 2009/0224229 A1 | 9/2009 | Razeghi | |

(Continued)

FOREIGN PATENT DOCUMENTS

EP 1100168 A1 5/2001

OTHER PUBLICATIONS

Welser et al., "U.S. Appl. No. 12/829,997, Thin Film Solar Cells on Coated Glass and Methods of Constructing the Same", filed Jul. 2, 2010, Published in: USA.

(Continued)

*Primary Examiner* — Shannon M Gardner
(74) *Attorney, Agent, or Firm* — Loginov & Associates, PLLC; William A. Loginov

(57) ABSTRACT

Optically-thin, quantum-structured solar cells incorporating III-V quantum wells or quantum dots have the potential to revolutionize the performance of photovoltaic devices. Enhanced spectral response characteristics have been widely demonstrated in both quantum well and quantum dot solar cells using a variety of different III-V materials. To fully leverage the extended spectral response of quantum-structured solar cells, new device designs are disclosed that can both maximize the current generating capability of the limited volume of narrow band gap material and minimize the unwanted carrier recombination that degrades the voltage output.

8 Claims, 6 Drawing Sheets

(56) References Cited

U.S. PATENT DOCUMENTS

| | | | |
|---|---|---|---|
| 2010/0006143 A1* | 1/2010 | Welser | H01L 31/03046 |
| | | | 136/255 |
| 2010/0096010 A1 | 4/2010 | Welser | |
| 2010/0180941 A1 | 7/2010 | Lim | |
| 2010/0282314 A1 | 11/2010 | Coakley | |
| 2011/0120554 A1 | 5/2011 | Chhajed et al. | |

OTHER PUBLICATIONS

Welser et al., "U.S. Appl. No. 12/885,718, Thin Film Solar Cells on Flexible Substrates and Methods of Constructing the Same", filed Sep. 20, 2010, Published in: USA.

Welser et al., "U.S. Appl. No. 12/985,748, Quantum Well Waveguide Solar Cells and Methods of Constructing the Same", filed Jan. 6, 2011, Published in: USA.

Welser et al., "U.S. Appl. No. 13/528,581, Over-Coated Nano-Textured Films and Methods of Manufacturing the Same", filed Jun. 20, 2012, Published in: USA.

Welser et al., "U.S. Appl. No. 13/528,792, Laterally Scattering Antireflective Coatings and Methods of Manufacturing the Same", filed Jun. 20, 2012, Published in: USA.

Welser et al., "U.S. Appl. No. 13/528,803, Over-Coated Nano-Textured Films and Methods of Manufacturing the Same", filed Jun. 20, 2012, Published in: USA.

Welser et al., "U.S. Appl. No. 61/449,142 Diffuse Omni-Directional Back Reflectors and Methods of Manufacturing the Same", filed Jun. 20, 2011, Published in: USA.

Zhang et al., "Double-Layered TiO2-SiO2 Nanostructured Films With Self-Cleaning and Antireflective Properties", "J. Phys. Chem.", Sep. 22, 2006, pp. 25142-25148, vol. 110, No. 50, Publisher: American Chemical Society, Published in: USA.

Weiser, et al., "U.S. Appl. No. 12/719,811, Multijunction Solar Cell Employing Extended Heterojunction and Step Graded Antireflection structures and methods for constructing the same", Mar. 8, 2010, Published in: US.

Weiser, et al., "U.S. Appl. No. 61/525,707, High Efficiency Quantum Well Waveguide Solar Cells and Methods for Constructing the Sam", Aug. 19, 2011, Published in: US.

\* cited by examiner

United States Patent US 11,367,800 B1

OPTICALLY-THIN III-V SOLAR CELLS AND METHODS FOR CONSTRUCTING THE SAME

RELATED APPLICATIONS

This application is a divisional application of co-pending U.S. application Ser. No. 13/868,018, filed Apr. 22, 2013, entitled OPTICALLY-THIN III-V SOLAR CELLS AND METHODS FOR CONSTRUCTING THE SAME, which application claims the benefit of U.S. Provisional Application Ser. No. 61/736,450, filed Dec. 12, 2012, entitled HIGH-EFFICIENCY THICK-WELL QUANTUM-STRUCTURED SOLAR CELLS AND METHODS FOR CONSTRUCTING THE SAME, and claims the benefit of U.S. Provisional Application Ser. No. 61/636,587, filed Apr. 20, 2012, entitled MULTIJUNCTION OPTICALLY-THIN SOLAR CELLS, the entire disclosures of each of which applications is herein incorporated by reference.

STATEMENT REGARDING FEDERALLY SPONSORED RESEARCH OR DEVELOPMENT

This invention was made with U.S. government support under Grant Number FA9453-12-C-0316, awarded by the U.S. Air Force. The government may have certain rights in this invention.

FIELD OF THE INVENTION

The present invention relates generally to semiconductor-based photovoltaic energy converters, also known as "solar cells," and to the design and fabrication of the same. And, more particularly, to solar cells having quantum-structured materials and/or layers of quantum-structured materials incorporated therein.

BACKGROUND OF THE INVENTION

With appropriate electrical loading, photovoltaic solid state semiconductor devices, commonly known as solar cells, convert sunlight into electrical power by generating both a current and a voltage upon illumination. The current source in a solar cell is the charge carriers that are created by the absorption of photons. These photogenerated carriers are typically separated and collected by the use of PN or PIN junctions in semiconductor materials. The operational voltage of the device is limited by the dark current characteristics of the underlying PN or PIN junctions, among other limiting characteristics. Thus improving the power output performance of any solid state solar cell generally entails simultaneously maximizing absorption and carrier collection while minimizing dark diode current.

The solar electric conversion efficiency of conventional solar cells decreases as the cell thickness decreases due to incomplete absorption and the resulting decrease in short circuit current. However, the dark current can also decrease with decreasing cell thickness, particularly for photovoltaic devices operating in the radiative limit, resulting in an increase in open circuit voltage. It is desirable to leverage the inherent lower dark current of optically thin absorber layers. By incorporating light trapping structures, optically-thin solar cells can match or even exceed the performance of optically thick photovoltaic devices. Optically-thin photovoltaic devices also offer advantages compared to conventional structures in terms of increased robustness (including enhanced radiation tolerance) and reduced material costs.

Quantum well solar cells are optically-thin structures which seek to harness a wide spectrum of photons at high voltages in a single-junction device by embedding narrow energy-gap wells within a wide energy-gap matrix. By avoiding the limitations of current matching inherent in multi junction devices, quantum well waveguide solar cells have the potential to deliver ultra-high efficiency over a wide range of operating conditions. Quantum well solar cells have been demonstrated in a variety of different material systems, and the basic concept has been extended to include quantum dots. Clear improvements in lower energy spectral response have been experimentally confirmed in both quantum well and quantum dot solar cells. However, photon absorption, and thus current generation, is hindered in conventional quantum structured solar cells by the limited path length of incident light passing vertically through the device. Moreover, the insertion of narrow energy-gap material into the device structure often results in lower voltage operation, and hence lower photovoltaic power conversion efficiency.

Optical scattering into laterally propagating waveguide modes provides a physical mechanism to dramatically increase photocurrent generation in quantum well solar cells via in-plane light trapping. The refractive index contrast in a typical quantum well solar cell provides lateral optical confinement and naturally forms a slab waveguide structure. Coupling of normally incident light into lateral optical propagation paths has been reported to lead to increases in the short circuit current of InP/InGaAs quantum well waveguide solar cells coated with nanoparticles. However, maintaining high open circuit voltage remains a universal challenge for all quantum well and quantum dot solar cell devices. It is therefore desirable to provide a device with a novel material structure to achieve high open circuit voltages.

Quantum well and quantum dot solar cells suffer from high dark currents and lower operating voltages. It is thus desirable to provide a solar cell structure capable of minimizing dark current and maximizing photon absorption.

SUMMARY OF THE INVENTION

A solar cell structure is capable of minimizing dark current and maximizing photon absorption by including at least one semiconductor junction depletion region that extends into a base layer, according to an illustrative embodiment. At least one narrow band gap quantum well structure is embedded within the base layer of the solar cell structure. In accordance with the illustrative embodiment, a wider energy gap extended emitter structure is included that has material in both the emitter and depletion region adjacent to the emitter. The wider energy gap extended emitter structure having a band gap that is approximately equal to, or greater than, the band gap of the base layer material. The narrow band gap quantum well structure can include at least one thick well, that is equal to or greater than the thickness at which quantum confinement effect becomes negligible.

In accordance with the illustrative embodiments, the at least one thick well has a compositionally graded profile. The at least one thick well can also or alternatively have a layer of quantum dots embedded within the thick well to form an effective dot in a thick well structure. In further embodiments, two layers of quantum dots can be embedded within the thick well, including a first layer for enhanced hole confinement and a second layer for enhanced electron confinement.

A method for fabricating a thick-well quantum-structured solar cell comprises providing a solar cell structure including a semiconductor junction depletion region spanning an emitter and a base layer and then embedding a plurality of narrow energy-gap wells within the base layer of the solar cell structure. The narrow energy-gap wells can comprise at least one InGaAs quantum well. The method for fabricating, manufacturing or otherwise constructing the solar cell can further comprise the step of employing a wider energy-gap material in the emitter and inserting the wider energy-gap material into the depletion region of the solar cell structure that is adjacent to the emitter. In an embodiment, the plurality of narrow energy-gap wells can be synthesized by employing metal-organic chemical vapor deposition (MOCVD). In further embodiments, the plurality of narrow energy-gap wells employ a step-graded compositional profile to form a series of small energy steps that photogenerated carriers overcome to escape the wells.

BRIEF DESCRIPTION OF THE DRAWINGS

The invention description below refers to the accompanying drawings, of which.

DETAILED DESCRIPTION

In an illustrative embodiment, in order to minimize non-radiative recombination and approach the radiative limit of dark current operation, a basic photovoltaic device structure can desirably employ two or more energy gap semiconductor materials, such that the narrow energy gap absorber material is embedded within a higher energy gap matrix. Moreover, the narrow energy gap and wide energy gap materials can be positioned within a PN or PIN junction diode in such a manner that non-radiative processes are largely confined to the wider energy gap material and disposed away from the narrow energy gap material. In general, the wide energy gap material can be composed of multiple layers, as can the narrow energy gap absorber material. In particular, the narrow energy gap, optically-thin absorber layer materials can comprise a single well layer, multiple well layers, multiple quantum dot layers, or multiple layers of quantum dots in a well or any combination thereof within ordinary skill. In accordance with the illustrative embodiments, the absorber layer structure can comprise group III-V materials, group IV materials, chalcogenide materials, or other materials known in the art.

An extended wide band gap emitter structure is one example of this overall photovoltaic absorber structure design concept that can effectively reduce non-radiative n=2 and n=1 components of the dark current. One element of this novel device structure design is the use of wide band gap material both in the emitter layer and in the depletion region adjacent to the emitter. A second critical element of this design is that the heterojunctions between the extended wide band gap emitter material and the base layer, and between the base layer and any narrow band gap well material, be placed within the built-in electric field of the depletion region. An optional third element of this device structure is the use of two or more wide band gap materials with band offsets that hinder the diffusion of carriers from the emitter into the base.

Figure 1:
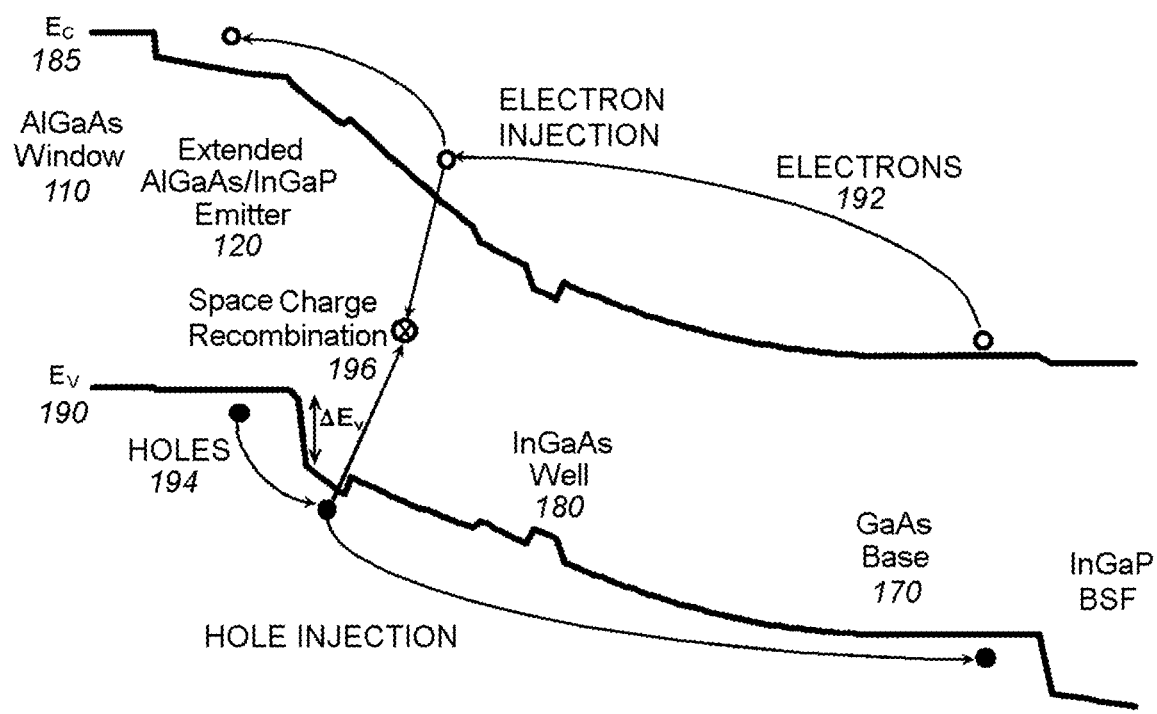
FIG. 1 is a graphical diagram of the energy band versus position for a material structure of a semiconductor solar cell, illustrating various dark diode current mechanisms, in accordance with an illustrative embodiment.

The basic functionality of an extended bang gap emitter structure as applied to InGaAs quantum well solar cells is summarized in FIG. 1. Further details and examples of an extended wide band gap emitter structure are disclosed in commonly assigned U.S. Provisional Pat. App. Ser. No. 61/525,707, entitled HIGH EFFICIENCY QUANTUM WELL WAVEGUIDE SOLAR CELLS AND METHODS FOR CONSTRUCTING THE SAME, by Roger E. Welser and Ashok K. Sood, filed Aug. 19, 2011; U.S. patent application Ser. No. 12/985,748, entitled QUANTUM WELL WAVEGUIDE SOLAR CELLS AND METHODS OF CONSTRUCTING THE SAME, by Roger E. Welser and Ashok K. Sood, filed Jan. 6, 2011; U.S. patent application Ser. No. 12/885,718, entitled THIN FILM SOLAR CELLS ON FLEXIBLE SUBSTRATES AND METHODS OF CONSTRUCTING THE SAME, by Roger E. Welser and Ashok K. Sood, filed Sep. 20, 2010; U.S. patent application Ser. No. 12/829,997, entitled THIN FILM SOLAR CELLS ON COATED GLASS AND METHODS OF CONSTRUCTING THE SAME, by Roger E. Welser and Ashok K. Sood, filed Jul. 2, 2010; and U.S. patent application Ser. No. 12/719,811, entitled MULTIJUNCTION SOLAR CELL EMPLOYING EXTENDED HETEROJUNCTION AND STEP GRADED ANTIREFLECTION STRUCTURES AND METHODS FOR CONSTRUCTING THE SAME, by Roger E. Welser and Ashok K. Sood, filed Mar. 8, 2010, the teachings of which are each expressly incorporated herein by reference.

With reference to FIG. 1, as with conventional heterojunction structures, the larger energy gap of emitter 120 relative to the base 170 reduces the diffusion of electrons 192 out of the n-type base layer. In addition, hole diffusion 194 is suppressed in this structure by placing a thin InGaP layer (not shown) adjacent to the p-type AlGaAs emitter 120. The large valence band offset ($\Delta E_v$) at the type II InGaP barrier/AlGaAs emitter 120 interface also alters the distribution of holes 194 within the depletion region. By reducing the hole concentration injected from the p-type AlGaAs emitter 120, the region of enhanced recombination within the depletion region can be pulled closer to the p-side of the structure, away from the InGaAs well region 180 and into the wide band gap material in the depletion region adjacent to the emitter, thus reducing space charge recombination 196. The extended AlGaAs emitter 120/InGaP barrier structure illustrated in FIG. 1 thus reduces both the non-radiative n=1 diffusion and n=2 space charge recombination components of the diode dark current.

Reference is now made to FIGS. 2A through 2D detailing schematic cross-sectional side views of optical scattering from structured films according to various illustrative embodiments. In general, optically-thin solar cell structures contain a limited volume of low band gap material, and thus require advanced light trapping structures to increase the current generating capabilities. Light management is achieved by assuring that incident photons are not lost due to reflections but are instead directed into the semiconductor absorbing layers. The scattering of incident light to ensure each photon has a non-normal trajectory is a strategy for increasing the optical path length of photons within the absorption layer. In addition, the application of a back reflector to bounce any unabsorbed photons back up into the active layers of the device is a beneficial aspect of any effective photovoltaic light trapping scheme. The most effective light trapping schemes will simultaneously redirect vertically incident light horizontally into the plane of the absorbing layer.

Enhanced optical properties typically exist when an optical film is three-dimensionally structured and effectively composed of two or more materials. In particular, elastic scattering can occur in films with sub-wavelength structures, altering the angular pattern of light propagation beyond the straightforward application of the physical optics laws of refraction and reflection, as shown by the scattered, refracted and reflected light in FIGS. 2A-2D. Structured films can be formed from optical coatings that also incorporate nanoparticles (FIG. 2A) or nanorods (FIG. 2C) which differ in refractive index from that of their surrounding material. Alternatively, structured films can comprise etched semiconductor materials that are either left uncoated or overcoated with a lower refractive index material (FIG. 2B), or can result from conformal deposition on a nanostructured substrate (FIG. 2D). Examples of optical scattering from these various types of structured films are depicted in FIGS. 2A-2D.

Figure 2A:
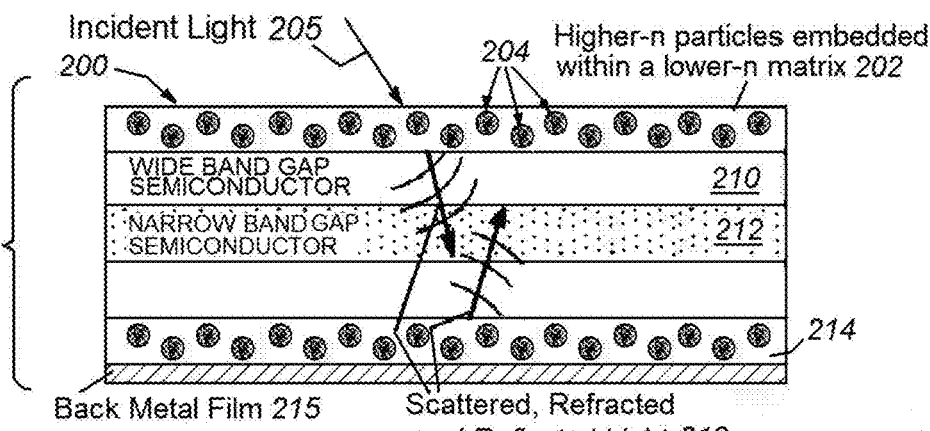
FIG. 2A is a schematic cross-sectional side view of a structured film having nanoparticles embedded in a low-n matrix layer, according to an illustrative embodiment.

Referring to FIG. 2A, a schematic cross-sectional side view of a photovoltaic device 200 showing optically scattering from structured films comprised of nanoparticles embedded within an optical film is shown. The application of a nanostructured graded-refractive-index (GRIN) optical coating minimizes reflection losses and maximizes photon recycling in thin-film solar cells. By adjusting the dimensions of the nanostructures within the optical coatings, the scattering efficiency into laterally propagating optical modes is increased, thereby significantly enhancing the optical path length of incident photons. In accordance with an illustrative embodiment, diffuse scattering nanostructured optical coatings are applied to both sides of the device to maximize the light trapping within the ultra-thin layers.

The photovoltaic device 200 includes a top layer 202 of higher-n particles 204 embedded within a lower-n matrix. As incident light 205 passes through the top nanoparticle embedded layer, it is scattered into the wide band gap semiconductor material 210. The scattering cross-section and re-radiation patterns are a function of the particle size and shape, as well as the wavelength of the incident light and the optical constants of the particle and surrounding material. As the diameter of the nanoparticles approaches the wavelength of incident light, elastic scattering can alter the angular pattern of light propagation. The surrounding medium can also strongly influence the re-radiation pattern. Scattering strength can also be locally enhanced by the formation of surface plasmon polaritons on metallic particles (not shown, but readily applicable to those having skill). The refracted light 213 then passes through a narrow band gap semiconductor 212 and onto the back nanoparticle embedded film layer 214. This causes scattered, refracted and reflected light to be re-directed back into the narrow back gap semiconductor material 212. A back metal film 215 is also provided, onto which the back nanoparticle embedded film layer 214 is deposited.

Figure 2B:
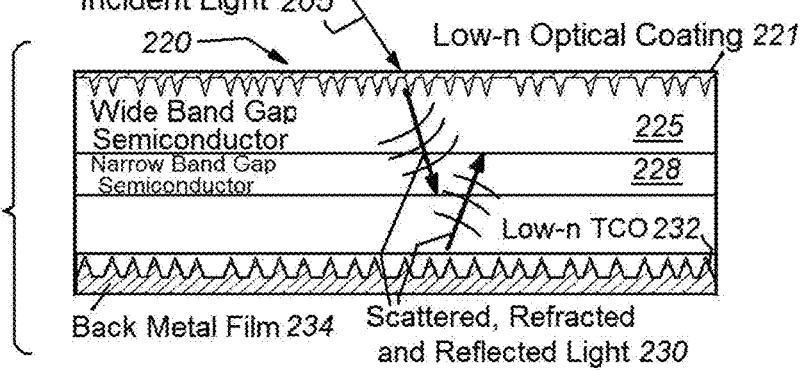
FIG. 2B is a schematic cross-sectional side view of a structured film having a nanotextured semiconductor surface overcoated with lower index coatings, according to an illustrative embodiment.

Reference is now made to FIG. 2B showing a schematic cross-sectional side view of a photovoltaic device 220 and the associated optical scattering from the nanotextured semiconductor surfaces overcoated with lower index coatings, according to an illustrative embodiment. For a more detailed description of the process for obtaining a nanotextured semiconductor surface overcoated with an optical film, refer to commonly assigned Ser. No. 61/613,262. As shown in FIG. 2B, incident light 205 passes through a nanotextured low-n optical coating 221, and enters the wide band gap semiconductor material 225, the light is scattered and passes through to the narrow band gap semiconductor material 228. The path of travel of the scattered, refracted and reflected light 230 is shown, and when the light reaches the low-n material such as a transparent conductive oxide (TCO) 232, the light is scattered, refracted and reflected back into the narrow band gap semiconductor material and wide band gap semiconductor material. Nanotexturing the back metal film, and then overcoating with a low-n TCO film, can be employed to construct structured films for optical scattering. As the diameter of the nanotexturing approaches the wavelength of the incident light, elastic scattering can alter the angular pattern of light propagation. Likewise, the surrounding medium can also strongly influence the re-radiation pattern.

Figure 2C:
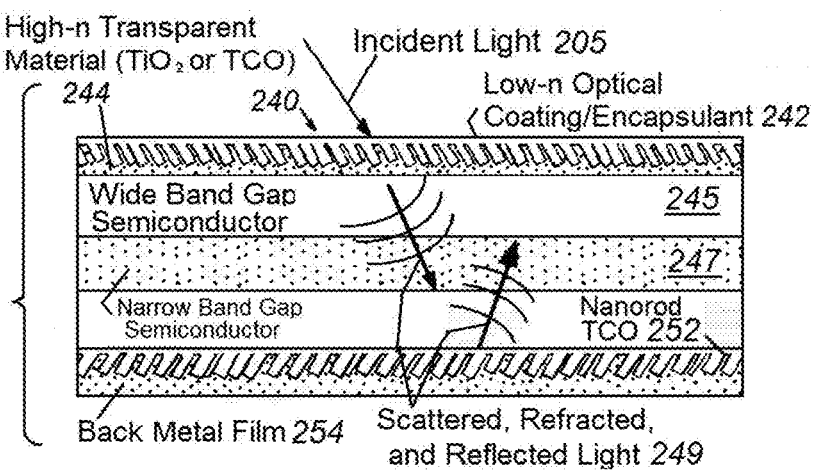
FIG. 2C is a schematic cross-sectional side view of a structured film having a nanotextured semiconductor surface overcoated with nanorod materials, according to an illustrative embodiment.
Figure 2D:
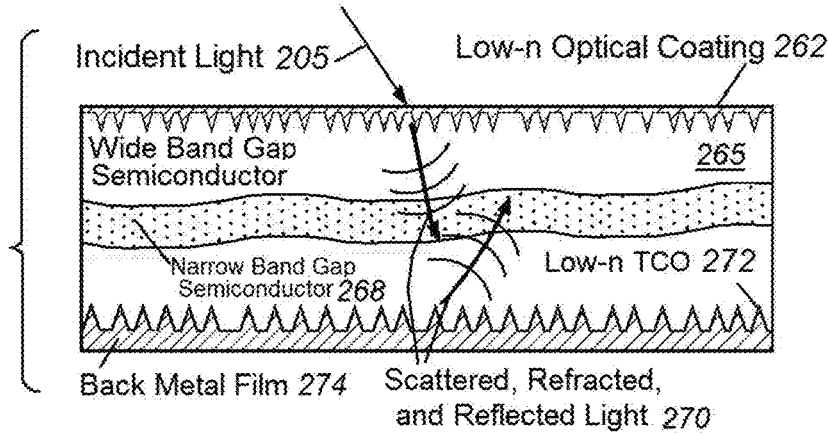
FIG. 2D is a schematic cross-sectional side view of a structured film resulting from conformal deposition on a nanostructured substrate, according to an illustrative embodiment.

Reference is now made to FIG. 2C showing a schematic cross-sectional side view of a photovoltaic device 240 having structured films comprised of nanorod materials, according to an illustrative embodiment. As shown in the photovoltaic device 240, a low-n optical coating/encapsulant 242 is coated over a high-n transparent material 244, such as $TiO_2$ or TCO. The nanorod embedded material 244 causes light scattering of incident light 205 into the wide band gap semiconductor 245 and through to the narrow band gap semiconductor 247. The scattered, refracted and reflected light 249 approaches the back nanorod TCO layer 252 coated on/with the back metal film 254, and is reflected back up into the narrow band gap semiconductor 247 and wide band gap semiconductor 245.

Reference is now made to FIG. 2D showing a schematic cross-sectional side view of a photovoltaic device 260 that results from conformal deposition of a nanostructured substrate, according to an illustrative embodiment. In accordance with the illustrative photovoltaic device 260 of FIG. 2D, conformal growth occurs on the nanostructured substrate to provide the desired light scattering properties. As shown, incident light 205 passes through a low-n optical coating 262 having conformal growth on the wide band gap semiconductor 265 causes scattering of the incident light 205. The light passes through to the narrow band gap semiconductor 268 and reaches the back low-n TCO layer 272 and back metal film 274. The low-n TCO layer also includes conformal growth on the nanostructured substrate to provide the desired scattering properties. The scattered, refracted and reflected light 270 is re-directed back into the photovoltaic device 260 to further improve the efficiency thereof.

Optically-Thin, Single-Junction Solar Cell

Figure 3:
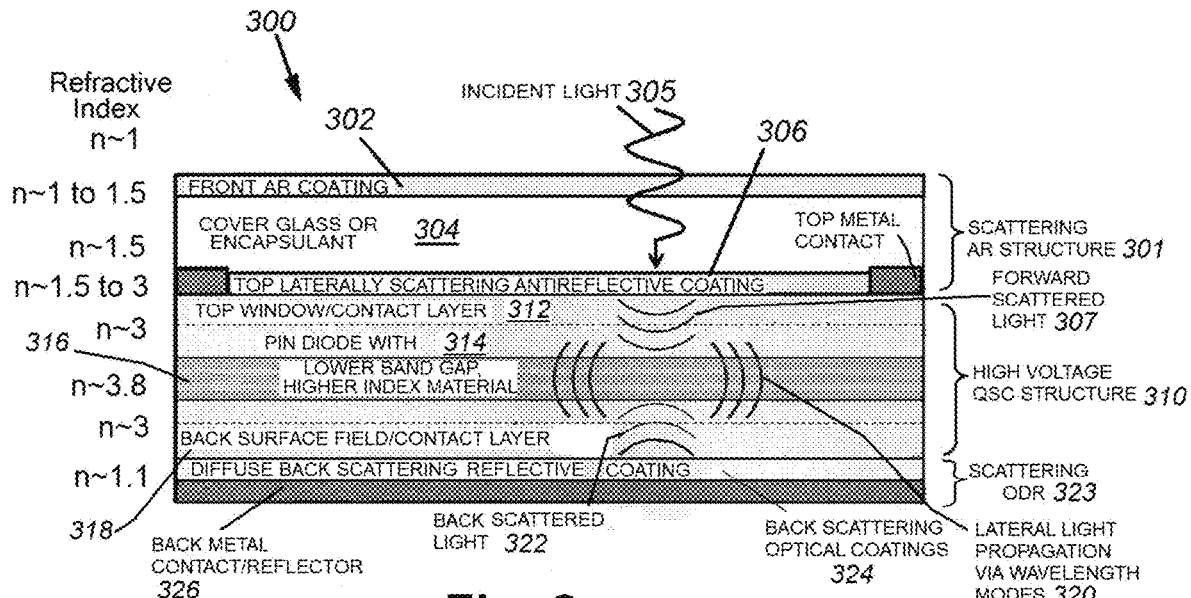
FIG. 3 is a schematic cross-sectional side view of an optically-thin solar cell that incorporates nanostructured, optical coatings to increase the optical path length of incident light through the active region of the photovoltaic device, according to an illustrative embodiment.

FIG. 3 depicts a device architecture for achieving high efficiency photovoltaic performance in an optically-thin single-junction solar cell. The device 300 consists of a high voltage semiconductor diode 314 embedded with lower band gap absorber material 316, sandwiched between a top antireflection (AR) structure 301 and a back Omni-directional reflector (ODR) structure 323. In this example, both the top AR structure 301 and back ODR structure 323 employ structured films to trap incident light and induce lateral scattering into the absorber layer structure 310.

The high voltage semiconductor diode 314 can employ an extended wide band gap emitter to reduce non-radiative dark current components. As previously discussed, the lower band gap, higher index material 316 can be comprised of single or multiple layers of quantum well, quantum dot, or quantum dot in a well layers, but is not limited to such quantum solar cell (QSC) structures. In particular the narrow band gap well or wells can be of a thickness beyond that at which quantum effects are observed. In general, the absorber layer structure 310 can comprise group III-V materials, group IV materials, or chalcogenide materials. Examples of lower band gap III-V materials include InGaAs alloys, InGaAsN and other dilute nitride materials, InN and high-indium content InGaN alloys, and InAsSb and related alloys.

The top AR structure 301 comprises a cover glass or encapsulant 304 with an appropriately designed AR coating 306 between the cover glass and the semiconductor diode, and optionally also a front AR coating 302. One or more of the components in the AR structure desirably contains structured materials that can both minimize reflection losses and induce lateral scattering of incident light into the underlying semiconductor diode 314 (shown as light propagation 320, 322). For example, laterally scattering antireflective coatings can employ porous layers, or layers of an optical film embedded with particles, or over-coated textured layers, as disclosed in commonly assigned patent applications Ser. Nos. 61/499,150 and 61/613,262. The cover glass 304 can also employ light scattering structures, such as the pseudomorphic glass described by Wilt et al. at the 37$^{th}$ IEEE PVSC.

The back reflector structure 323 can consist of a metal film 326, or a combination of a metal film 326 and low refractive index coatings 324, designed to maximize internal reflections. Furthermore, the back reflector 326 can contain structures that induce lateral optical scattering back into the semiconductor diode, structures such as the diffuse ODR structure disclosed in commonly assigned co-pending U.S. Provisional Pat. App. Ser. No. 61/499,142, entitled DIFFUSE OMNI-DIRECTIONAL BACK REFLECTORS AND METHODS OF MANUFACTURING THE SAME, by Roger E. Welser and Ashok K. Sood, filed Jun. 20, 2011, the teachings of which are expressly incorporated herein by reference, or other plasmonic or photonic crustal structures designed to maximize laterally propagating internal reflections, particularly at longer wavelengths that match the absorption band of the lower band gap absorber material in the overlying semiconductor diode.

The light trapping induced by the AR structure 301 and back ODR 323 in the device 300 depicted in FIG. 3 provides two distinct benefits for quantum solar cells and other optically-thin photovoltaic devices. First, it enables better use of the low volume of narrow band gap material by increasing the effective path length of incident photons though the absorber layer. Second, photon recycling of emitted photons provides a mechanism to increase the voltage of devices operating in the radiative limit.

Optical scattering into laterally propagating waveguide modes (see scattering 320) in particular provides a physical mechanism to dramatically increase photocurrent generation in optically-thin solar cells via in-plane light trapping. In general, the combination of a high voltage quantum solar cell structure and advanced light trapping concepts provides a pathway to achieve single-junction efficiencies exceeding 30% over a wide range of spectrums, including an AM0 space spectrum.

Optically-Thin Solar Cell with Multiple Junctions

The device concept for a high-efficiency, single-junction, optically-thin solar cell described herein with reference to FIG. 3 can also be extended in scope and employed as the bottom subcell in a multi junction device to obtain even higher efficiency performance. Reference is now made to the multi junction device 400 depicted in FIG. 4 which includes the insertion of a higher energy gap top subcell and appropriate tunnel junction.

In accordance with an illustrative embodiment, the antireflective structure 401 includes a front AR coating 402, a cover glass or encapsulant 404 and a top laterally scattering AR coating 406, to generate forward scattered light 407. The device 400 further includes the scattering ODR structure 423, which includes a diffuse back scattering reflective coating 424 and back metal contact/reflector 426. The back reflective coating generates the back scattered light 422 into the multijunction solar cell structure 410. The bottom subcell 416 has a top subcell 412 and appropriate tunnel junction 414 inserted therebetween for optimum light scattering properties.

In an illustrative embodiment, when III-V materials are used to build the multi junction structure, the top subcell can consist of a conventional, optically-thick cell such as the InGaP subcells employed in state-of-the-art multi junction solar cells and routinely used for space power applications. The top subcell can also employ an extended wide band gap emitter structure, such as those detailed in commonly assigned co-pending U.S. patent application Ser. No. 12/719,811, entitled MULTIJUNCTION SOLAR CELL EMPLOYING EXTENDED HETEROJUNCTION AND STEP GRADED ANTIREFLECTION STRUCTURES AND METHODS FOR CONSTRUCTING THE SAME, by Roger E. Welser and Ashok K. Sood, filed Mar. 8, 2010, the teachings of which are each expressly incorporated herein by reference.

In an illustrative embodiment, to reduce the diode dark current below that obtained in conventional structures, wider energy-gap InGaP and AlGaAs material has been employed in the emitter and inserted into the depletion region adjacent to the emitter, forming an extended wide band gap emitter heterojunction structure. Single InGaAs quantum wells are located within the built-in field of the junction depletion region. The effective energy gap of the InGaAs well is a function of both the well composition and thickness, and can be quantified by photoluminescence (PL) emissions. In an illustrative embodiment, InGaAs quantum well solar cell structures are synthesized on semi-insulating GaAs substrates via metal-organic chemical vapor deposition (MOCVD).

The top subcell can also comprise narrow energy gap wells such as AlGaAs surrounded by InGaP or higher aluminum containing AlGaAs alloys. Tunnel junctions are required to electrically connect the subcells and are well described by prior art. Tunnel junctions are routinely used in state-of-the art multi junction solar cells for space power applications.

Figure 4:
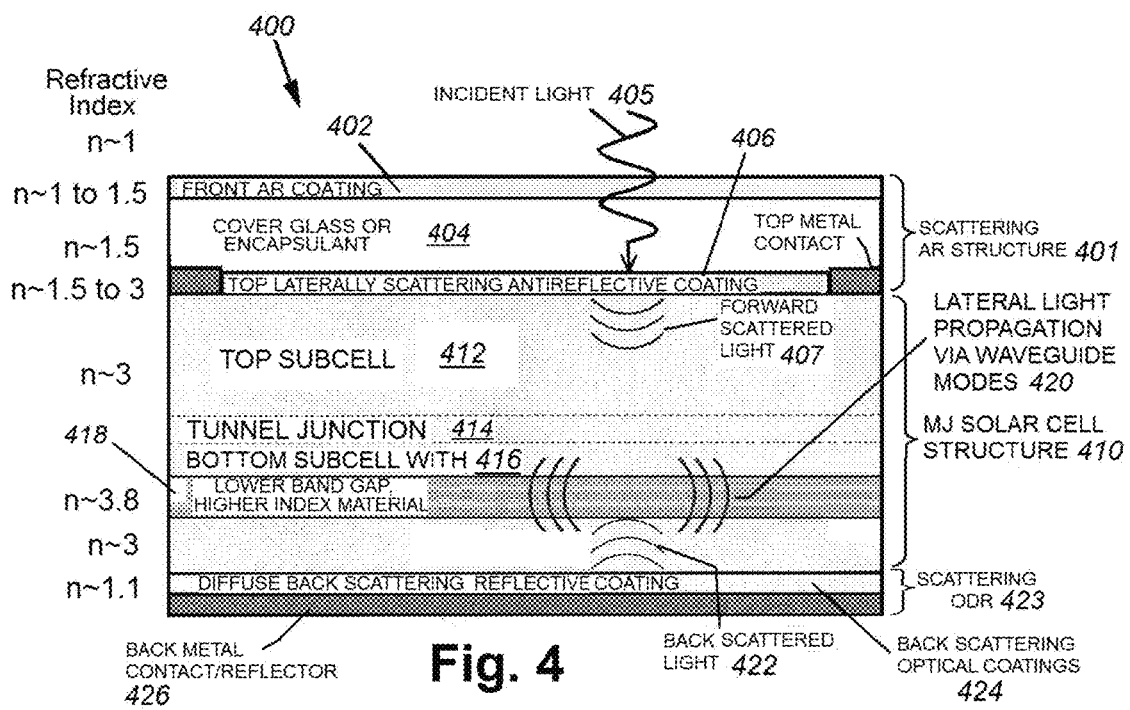
FIG. 4 is a schematic cross-sectional side view of an optically-thin solar cell having multiple junctions incorporating nanostructured, optical coatings to increase the optical path length of incident light through the active region of the photovoltaic device.

While the schematic shown FIG. 4 depicts a dual junction device, it is expressly contemplated that the device concept disclosed herein can be extended to devices with three or more junctions. One critical design criterion is that an optically-thin cell can be employed as the bottom subcell in order to fully benefit from the back reflector.

Optically-Thin, Dual-Junction Solar Cell Employing Chalcogenide Materials

Figure 5:
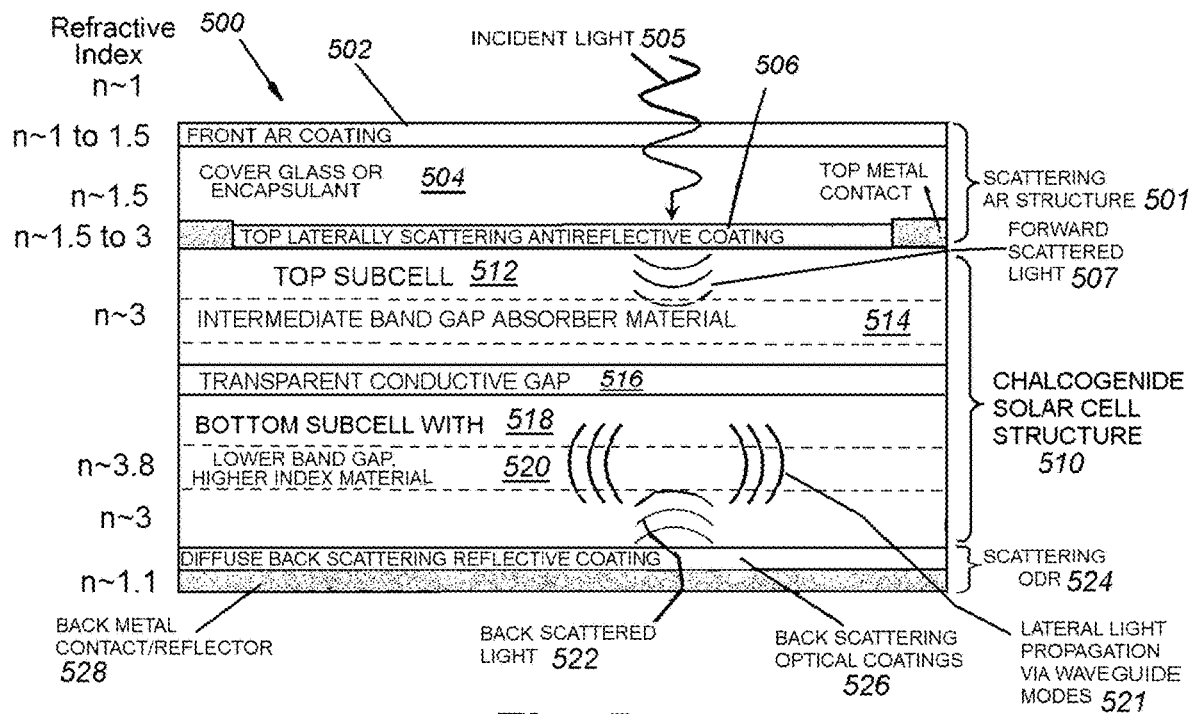
FIG. 5 is a schematic cross-sectional side view of an optically-thin solar cell having multiple junctions of chalcogenide materials which incorporate nanostructured, optical coatings to increase the optical path length of incident light through the active region of the photovoltaic device.

FIG. 5 depicts an optically-thin solar cell 500 with multiple junctions in which chalcogenide materials are employed to build the device. In accordance with an illustrative embodiment, an antireflection structure 501 and ODR structure 524 are provided with the chalcogenide solar cell structure 510 sandwiched therebetween. The scattering AR structure 501 can include a front AR coating 502, a cover glass or encapsulant 504 and a top laterally scattering AR coating 506. The scattering AR structure 501 causes the forward scattered light 507 to scatter into the top subcell 512 having an intermediate band gap absorber material 514. The scattering ODR 524 includes a diffuse back scattering reflective coating 526, which generates the back scattered light 522, and also includes a back metal contact/reflector 528. The chalcogenide solar cell structure 510 comprises a top subcell 512 with intermediate band gap absorber material 514, a transparent conductive contact 516 to operatively connect the top subcell 512 with a bottom subcell 518 having a lower band gap, higher index material 520 embedded thereon. This material causes the lateral light propagation via wageguide modes 521.

In an illustrative embodiment, for example, the top subcell can comprise CIGS materials with low indium and high gallium content, while the bottom subcell can comprise CIGS materials with high indium and low gallium content. Either or both of the subcells can employ an extended wide band gap heterojunction emitter structure. For instance, the bottom subcell can comprise CIGS with very low gallium content (e.g. CIS or similar) embedded within CIGS with an intermediate Ga content (e.g. Ga~30%). The top subcell can comprise CIGS with higher gallium content (e.g. Ga~70%) embedded within CIGS with a very high Ga content (e.g. CGS or similar).

To maximize the optical path length through the chalcogenide semiconductor absorber layers, the top AR and back ODR structures can employ structured materials, as described hereinabove in greater detail. The structure can be fabricated by mechanically stacking and electrically connecting the two subcells, or other techniques known in the art. Mechanical stacking can be accomplished via the use of lift-off processes that remove the chalcogenide absorber layers from the mechanical substrates used for material deposition. The transparent conductive contact can consist of transparent conductive oxide materials, thin metal films, and/or patterned metal fingers, readily applicable to those of skill in the art.

Thick-Well Quantum-Structured Solar Cell

Figure 6:
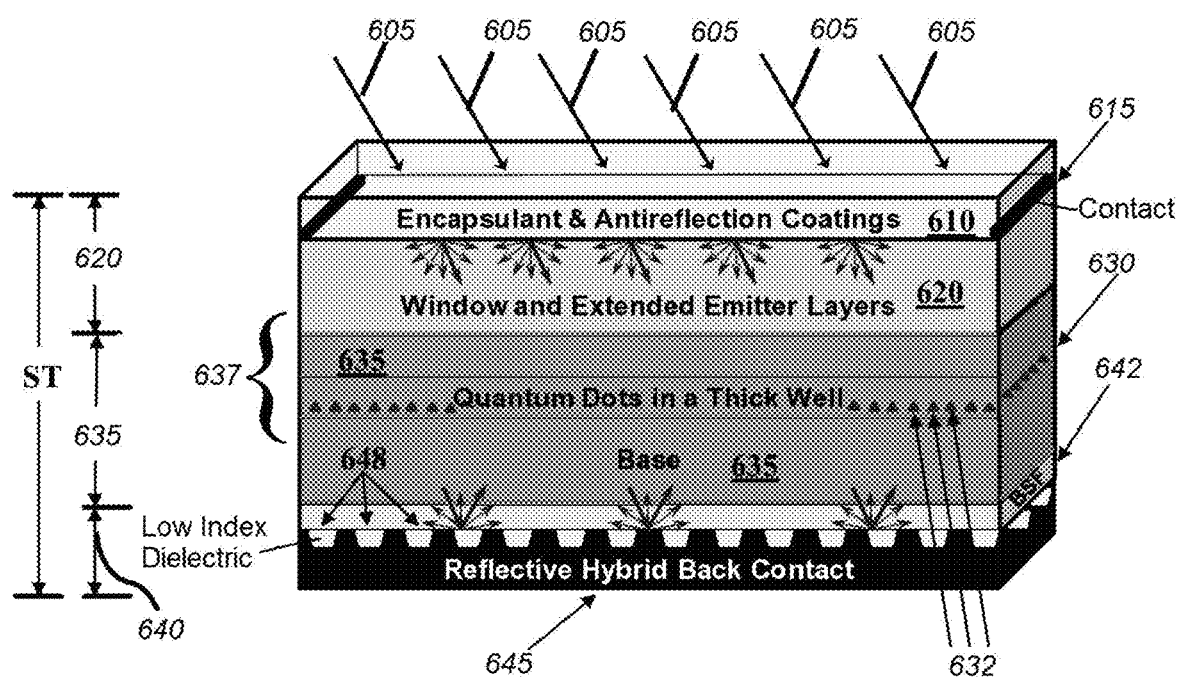
FIG. 6 is a schematic cross-sectional side view of a quantum-structured solar cell having at least one narrow band gap quantum well embedded within a base layer and a wider energy gap extended emitter including material in both the emitter and the depletion region, according to an illustrative embodiment.

Reference is now made to FIG. 6 showing a cross-sectional schematic side view of a thick-well quantum-structured solar cell 600 and the effect on photons 605 interacting with and/or passing through the solar cell 600. Encapsulant and antireflection coatings 610 are employed to protect the device and to minimize the reflection of incident photons 605. The structure includes an extended wide band gap emitter 620 to minimize non-radiative current, and a thick well 630 with embedded quantum dots 632 within the base layer 635.

It has been observed by the inventors herein that the use of a thick well rather than a conventional thin well is desirable in that the radiative dark current is independent of well thickness, while the absorption per well increases with well thickness. The observed trend includes wells that approach or exceed the thickness at which quantum confinement effects become negligible. This observation presents certain unexpected results versus the conventional approach, which has focused on thin well designs.

The thick well layer 630 with optional quantum dots 632 has a smaller energy gap than the surrounding base layer 635. The window and extended emitter layers 620 have a band gap that is larger or approximately equal to the band gap of the base layer 635. The window and back surface field (BSF) layers 640 also include material with a band gap that is larger or equal to the base layer, and can also include additional heavily doped layers to improve electrical contact to the top and back surfaces of the device, as should be readily apparent to those having ordinary skill in the art. The back contact 645 also serves as a reflector of both unabsorbed and emitted photons. In the illustrative embodiment, the total semiconductor thickness (ST) is approximately 1 micron, but can reasonably range from approximately 0.5 micron to 4 or 5 microns. The semiconductor thickness is variable within ordinary skill to achieve features described herein and varies depending upon its application and materials used. To increase scattering into the narrow band gap well layer 630 and base layer 635, the back contact employs a textured, hybrid structure 648, which mixes a metal film with a low index dielectric in a three-dimensional structure.

Illustratively, the thick well structure 630 can comprise a single well or multiple wells. The wells are desirably placed within the junction depletion region 637. Dark current can be minimized by limiting the number of wells. Each well can be compositionally graded, for instance, in such a way as to enhance carrier extraction. Refer to the commonly assigned co-pending '530 Patent Application for a more detailed description of a compositionally graded well, the teachings of which are expressly incorporated hereinabove by reference. One or more of the wells can include a layer of embedded quantum dots 632. The embedded quantum dots are illustratively placed in the middle of the well, but do not need to be placed in the middle of the well—asymmetric placement closer to the top or bottom of the well is, in certain embodiments, more desirable for carrier extraction and dark current suppression. Further designs can also include two layers of dots within the well—one layer closer to the top and the other layer closer to the bottom. It is possible for one layer to be provide enhanced hole confinement and another layer to provide enhanced electron confinement. More specifically, two quantum dot layers embedded within one well employs, on one side of the well, a quantum dot material with little to no conduction band offset, and on the other side of the well, a quantum dot material with little to no valence band offset with the surrounding well and base material. Such a design would provide enhanced hole confinement and the other enhanced electron confinement.

By leveraging band alignments, and particularly the use of materials with type-II band alignment, it is possible to engineer carrier extraction from the dots and well(s). The thickness of the well can approach or even exceed (i.e. is approximately equal to or greater than) the thickness at which quantum confinement effects become negligible. This thickness should be readily derivable for a person having ordinary skill in the art. For example, photoluminescence (PL) measurements of quantum wells with increasing thickness generally exhibit a peak energy that decreases to a value equal to the bulk energy gap of the well material. The thickness at which the quantum well peak PL energy becomes indistinguishable from the bulk value depends upon the material properties of the well and barrier materials. In many combinations of III-V materials, the thickness is approximately 15 nm.

The antireflection structure 610 and back reflector structure 640 shown in FIG. 6 can employ optically scattering designs such as those described in commonly assigned co-pending U.S. patent application Ser. No. 13/528,581, entitled DIFFUSE OMNI-DIRECTIONAL BACK REFLECTORS AND METHODS OF MANUFACTURING THE SAME, by Roger E. Welser and Ashok K. Sood, filed Jun. 20, 2012; commonly assigned co-pending U.S. patent application Ser. No. 13/528,792, entitled LATERALLY SCATTERING ANTIREFLECTIVE COATINGS AND METHODS OF MANUFACTURING THE SAME, by Roger E. Welser and Ashok K. Sood, filed Jun. 20, 2012, and commonly assigned co-pending U.S. patent application Ser. No. 13/528,803, entitled OVER-COATED NANO-TEXTURED FILMS AND METHODS OF MANUFACTURING THE SAME, by Roger E. Welser and Ashok K. Sood, filed Jun. 20, 2012, the teachings of which are each expressly incorporated herein by reference. To further increase scattering into the narrow band gap well and base layers, the back contact can employ a textured, hybrid structure 645, which mixes a metal film with a low index dielectric in a three-dimensional structure 648. This hybrid back contact structure can also be applied to other thin-film cell technologies such as CIGS (copper indium gallium selenide).

Manufacturing Process for Thick-Well Quantum-Structured Solar Cell

Figure 7:
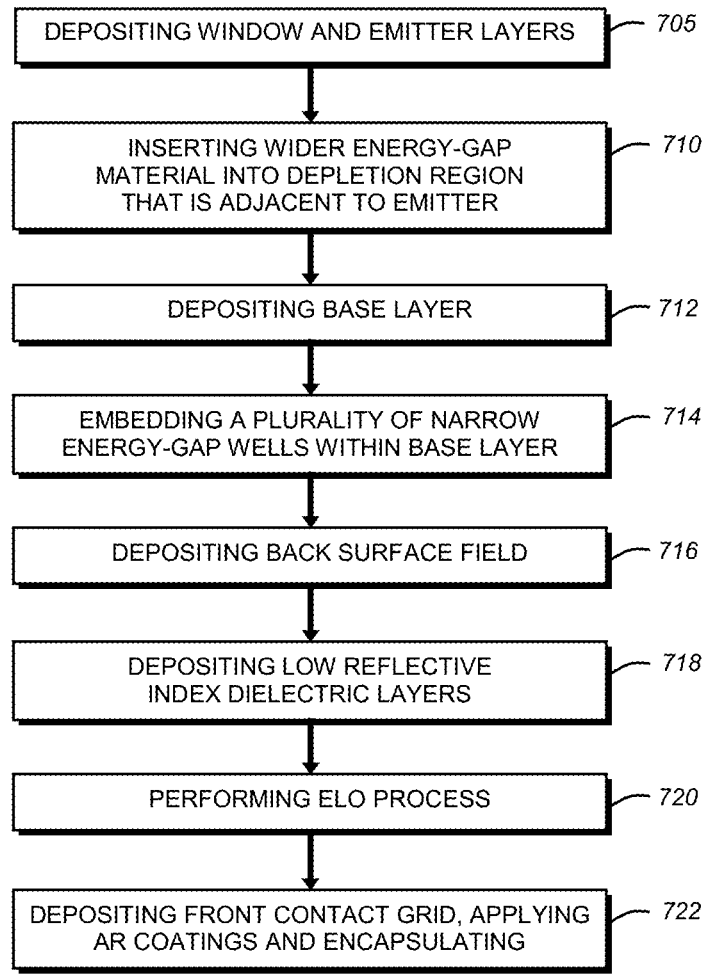
FIG. 7 is a flow diagram of a procedure for constructing a thick-well quantum-structured solar cell, according to an illustrative embodiment.

Reference is now made to FIG. 7 showing a flow chart of a procedure for constructing a high-efficiency thick-well quantum-structured solar cell in accordance with an illustrative embodiment. The semiconductor window and extended emitter layers, base layer, well layer and embedded quantum dot, back surface field, and contact layers (respectively 620, 635, 630, 642 and 645 in FIG. 6) can be deposited by metal organic chemical vapor deposition (MOCVD) on either a GaAs or InP substrate. In an illustrative embodiment, the epitaxial layers are grown inverted, such that the top contact and window layers are grown first and the back contact and back surface field layers grown last. In this way, an epitaxial lift-off (ELO) process can be used to remove the device epitaxial layers from the rigid GaAs or InP substrate. MOCVD growth and ELO processing can be performed at III-V foundries, such as MicroLink Devices in Niles, Ill.

With reference to FIG. 7, the procedure 700 commences at step 705 by depositing the window and emitter layers. At step 710, the procedure then inserts a wider energy-gap material into the depletion region that is adjacent to the emitter. At step 712, the procedure continues by depositing base layer and then embedding a plurality of narrow energy-gap wells within the base layer at step 714. Prior to ELO, a back metal contact is illustratively deposited at step 716.

After growth and prior to the ELO process step, low refractive index (RI) dielectric layers can be deposited on the "top" epitaxial surface at step 718 which will become the back of the solar cell after ELO. For instance, nanostructured indium tin oxide can be deposited via oblique angle deposition. Alternatively, non-conductive, low refractive index material such as silicon dioxide ($SiO_2$) can also be deposited if contact holes are provided, either by selective deposition or subsequent selective etching. The low refractive index dielectric can be either conventional dense material or porous material, for example nanostructured $SiO_2$ deposited by oblique angle deposition.

After ELO, the front contacts can be formed, antireflection coatings applied, and the finished devices separated and encapsulated at step 722. An antireflection structure can be applied to the top of the encapsulated cell at step 722.

GaAs-Based Designs

If a GaAs substrate is employed, suitable wide band gap materials for the emitter and extended emitter layers (for example 620 in FIG. 6) include AlGaAs and InGaP. One specific example employs an n-type InGaP emitter and an adjacent undoped or lightly p-type AlGaAs extended emitter.

If a GaAs substrate is employed, suitable narrow band gap materials for the well and quantum dots (for example layer 630 in FIG. 6) include InGaAs, InAs, GaAsSb, InAsSb, GaAsN, InGaAsN, and InGaAsNSb. One specific example includes InAs dots and wetting layer embedded within a step-graded InGaAs well. Alternatively, InGaAs dots and wetting layer can be embedded with a GaAsN well.

InP-Based Designs

If an InP substrate is employed, suitable wide band gap materials for the emitter and extended emitter layers (for example 620 in FIG. 6) include AlInAs, AlAsSb, and InP.

If an InP substrate is employed, suitable narrow band gap materials for the well and quantum dots (for example layer 630 in FIG. 6) include InAs, InGaAs, InGaAsP, GaAsSb, and InAsSb. One specific example is InAs dots and wetting layer embedded within a step-graded InGaAsP well. Alternatively, InAsSb dots and wetting layer can be embedded within a GaAsSb well It should now be clear the various features and advantageous that can be achieved by employing a photovoltaic device in accordance with the illustrative embodiment having enhanced light trapping and scattering properties. The optical path length can be optimized through use of scattering and antireflective coatings, as well as other techniques known in the art and readily applicable in view of the teachings herein.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments of the apparatus and method of the present invention, what has been described herein is merely illustrative of the application of the principles of the present invention. For example, the illustrative embodiments can include additional layers to perform further functions or enhance existing, described functions. Likewise, while not shown, the electrical connectivity of the cell structure with other cells in an array and/or an external conduit is expressly contemplated and highly variable within ordinary skill. More generally, while some ranges of layer thickness and illustrative materials are described herein. It is expressly contemplated that additional layers, layers having differing thicknesses and/or material choices can be provided to achieve the functional advantages described herein. In addition, directional and locational terms such as "top", "bottom", "center", "front", "back", "above", and "below" should be taken as relative conventions only, and not as absolute. Furthermore, it is expressly contemplated that various semiconductor and thin films fabrication techniques can be employed to form the structures described herein. Accordingly, this description is meant to be taken only by way of example, and not to otherwise limit the scope of this invention.

What is claimed is:

1. A photovoltaic device comprising:
    a solar cell structure including at least one semiconductor junction depletion region that extends into a base layer;
    a window layer;
    a back surface field layer;
    a contact layer;
    a quantum structure embedded within the base layer of the solar cell structure, the quantum structure comprising at least one narrow band gap quantum well layer; and
    a wider energy gap extended emitter structure comprised of material in both the emitter and the depletion region adjacent to the emitter, the wider energy gap extended emitter structure having a band gap equal to or greater than a band gap of the base layer material,
    wherein the narrow band gap quantum well structure includes at least one thick well having a thickness that is equal to or greater than a thickness at which quantum confinement effects become negligible,
    wherein the at least one thick well has a layer of quantum dots embedded within the at least one thick well, to form an effective dot in a thick well structure,
    wherein the narrow band gap quantum well structure includes at least one thick well with two layers of quantum dots embedded within the at least one thick well, the two layers including a first layer for providing enhanced hole confinement and a second layer for providing enhanced electron confinement.

2. The photovoltaic device of claim 1 wherein the at least one thick well has a compositionally graded profile.

3. The photovoltaic device of claim 1 further comprising at least two subcells, and at least the bottom subcell contains a narrow band gap well structure.

4. The photovoltaic device of claim 1 wherein the semiconductor depletion region comprises at least one PIN diode grown on a GaAs substrate, wherein the extended emitter structure comprises AlGaAs or InGaP material, wherein the quantum well structure comprises dilute nitride III-V material or InGaAs material with embedded InGaAs quantum dots.

5. The photovoltaic device of claim 1 wherein the semiconductor depletion region comprises at least one PIN diode grown on a InP substrate, wherein the extended emitter structure comprises AlInAs, InP, or AlAsSb material, wherein the quantum well structure comprises Sb-containing III-V material.

6. The photovoltaic device of claim 5 wherein the well structure also includes embedded quantum dots comprised of narrow energy gap material lattice-mismatched to InP, including InP or InAsSb alloys.

7. A photovoltaic device comprising:
    a solar cell structure including at least one semiconductor junction depletion region that extends into a base layer;
    a window layer;
    a back surface field layer;
    a contact layer;
    a quantum structure embedded within the base layer of the solar cell structure, the quantum structure comprising at least one narrow band gap quantum well layer; and
    a wider energy gap extended emitter structure comprised of material in both the emitter and the depletion region adjacent to the emitter, the wider energy gap extended emitter structure having a band gap equal to or greater than a band gap of the base layer material,
    wherein the narrow band gap quantum well structure includes at least one thick well having a thickness that is equal to or greater than a thickness at which quantum confinement effects become negligible,
    wherein the semiconductor depletion region comprises at least one PIN diode grown on a InP substrate, wherein the extended emitter structure comprises AlInAs, InP, or AlAsSb material, wherein the quantum well structure comprises Sb-containing III-V material.

8. A photovoltaic device comprising:
    a solar cell structure including at least one semiconductor junction depletion region that extends into a base layer;
    a window layer;
    a back surface field layer;
    a contact layer;
    a quantum structure embedded within the base layer of the solar cell structure, the quantum structure comprising at least one narrow band gap quantum well layer; and
    a wider energy gap extended emitter structure comprised of material in both the emitter and the depletion region adjacent to the emitter, the wider energy gap extended emitter structure having a band gap equal to or greater than a band gap of the base layer material,
    wherein the narrow band gap quantum well structure includes at least one thick well having a thickness that is equal to or greater than a thickness at which quantum confinement effects become negligible,
    wherein the semiconductor depletion region comprises at least one PIN diode grown on a InP substrate, wherein the extended emitter structure comprises AlInAs, InP, or AlAsSb material, wherein the quantum well structure comprises Sb-containing III-V material,
    wherein the well structure also includes embedded quantum dots comprised of narrow energy gap material lattice-mismatched to InP, including InP or InAsSb alloys.

* * * * *